(12) United States Patent
Bedeschi et al.

(10) Patent No.: US 8,149,616 B2
(45) Date of Patent: Apr. 3, 2012

(54) METHOD FOR MULTILEVEL PROGRAMMING OF PHASE CHANGE MEMORY CELLS USING ADAPTIVE RESET PULSES

(75) Inventors: Ferdinando Bedeschi, Monza (IT); Claudio Resta, Pavia (IT); Enzo Michele Donze, San Giuseppe Jato (IT); Roberto Gastaldi, Agrate Brianza (IT); Alessandro Cabrini, S. Angelo Lodigiano (IT); Guido Torelli, Sant'Alessio Con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 20 days.

(21) Appl. No.: 12/780,580

(22) Filed: May 14, 2010

(65) Prior Publication Data

US 2010/0284212 A1 Nov. 11, 2010

Related U.S. Application Data

(63) Continuation of application No. 12/648,454, filed on Dec. 29, 2009, now abandoned.

(30) Foreign Application Priority Data

Dec. 30, 2008 (IT) .............................. TO2008A1018

(51) Int. Cl.
*G11C 11/00* (2006.01)
(52) U.S. Cl. ........................................ 365/163; 365/148
(58) Field of Classification Search .................. 365/163
See application file for complete search history.

(56) References Cited

U.S. PATENT DOCUMENTS

| | | | |
|---|---|---|---|
| 6,670,628 B2 * | 12/2003 | Lee et al. | 257/4 |
| 7,486,536 B2 * | 2/2009 | Kim et al. | 365/148 |
| 7,787,291 B2 * | 8/2010 | Resta et al. | 365/163 |
| 7,835,171 B2 * | 11/2010 | Ono et al. | 365/148 |
| 7,965,537 B2 * | 6/2011 | Breitwisch et al. | 365/148 |
| 2003/0185047 A1 | 10/2003 | Khouri et al. | |
| 2004/0022085 A1 | 2/2004 | Parkinson et al. | |
| 2006/0022347 A1 * | 2/2006 | Campbell | 257/762 |
| 2006/0126380 A1 | 6/2006 | Osada et al. | |
| 2006/0220688 A1 | 10/2006 | Hsu et al. | |
| 2008/0151612 A1 | 6/2008 | Pellizzer et al. | |
| 2009/0008024 A1 | 1/2009 | Marchini et al. | |
| 2009/0080242 A1 | 3/2009 | Resta et al. | |
| 2009/0302293 A1 * | 12/2009 | Morikawa et al. | 257/2 |
| 2010/0165711 A1 * | 7/2010 | Lee | 365/163 |

* cited by examiner

*Primary Examiner* — Son Mai
(74) *Attorney, Agent, or Firm* — Seed IP Law Group PLLC

(57) ABSTRACT

A method for programming multilevel PCM cells envisages: forming an amorphous region of amorphous phase change material in a storage element of a PCM cell by applying one or more reset pulse; and forming a conductive path of crystalline phase change material through the amorphous region by applying one or more set pulse, a size of the conductive path defining a programmed state of the PCM cell and an output electrical quantity associated thereto, and being controlled by the value of the reset pulse and set pulse. The step of forming an amorphous region envisages adaptively and iteratively determining, during the programming operations, a value of the reset pulse optimized for electrical and/or physical properties of the PCM cell, and in particular determining a minimum amplitude value of the reset pulse, which allows programming a desired programmed state and a desired value of the output electrical quantity.

25 Claims, 12 Drawing Sheets

METHOD FOR MULTILEVEL PROGRAMMING OF PHASE CHANGE MEMORY CELLS USING ADAPTIVE RESET PULSES

BACKGROUND

1. Technical Field

The present disclosure relates to a method for multilevel programming of phase change memory cells and to a related phase change memory device.

2. Description of the Related Art

As is known, phase change memories use a class of materials having the property of switching between two phases having distinct electrical characteristics, associated with two different crystallographic structures: an amorphous, disorderly phase, and a crystalline or polycrystalline, orderly phase. The two phases are associated to resistivities of considerably different values.

Currently, the alloys of elements of group VI of the periodic table, such as Te or Se, referred to as chalcogenides or chalcogenic materials, are exploited in phase change memory cells. A currently widely used chalcogenide is formed from an alloy of Ge, Sb and Te ($Ge_2Sb_2Te_5$), also called GST, which has been proposed for storing information on overwritable disks and for mass storage. In chalcogenides, the resistivity varies by two or more orders of magnitude when the material passes from the amorphous (more resistive) phase to the crystalline (more conductive) phase, and vice versa.

Phase changes are obtained by locally increasing the temperature. Below a temperature of 150° C., both phases are stable. Starting from an amorphous state, and raising the temperature above 200° C., there is a rapid nucleation of crystallites and, if the material is kept at the crystallization temperature for a sufficiently long time, it undergoes a phase change to become crystalline. To bring the chalcogenide back to the amorphous state, the temperature is raised above the melting temperature (approximately 600° C.), and then a rapid cool off the chalcogenide is performed.

Memory devices exploiting the properties of chalcogenic material (also called phase change memory devices) have already been proposed.

As discussed in EP-A-1 326 254 (corresponding to US-A-2003/0185047) a memory element of a memory cell of a phase change memory device comprises a chalcogenic material and a resistive electrode, also called a heater (or "rapier").

From an electrical point of view, the crystallization temperature and the melting temperature are obtained by causing an electric current to flow through the resistive electrode in contact or in close proximity with the chalcogenic material, and thus heating the chalcogenic material by the Joule effect. In particular, when the chalcogenic material is in the amorphous, high resistivity state (also called the "reset state"), one can apply a voltage/current pulse of a suitable length and amplitude (or a number of such pulses) and allow the chalcogenic material to cool slowly. In this condition, the chalcogenic material changes its state and switches from a high resistivity to a low resistivity state (also called the "set state"). Vice versa, when the chalcogenic material is in the set state, one can apply a voltage/current pulse of suitable length and high amplitude so as to cause the chalcogenic material to switch back to the amorphous phase.

An advantageous approach to programming of phase change memory cells, that is particularly aimed at multilevel programming, is described in US2008/151612. A common reset pulse of a predefined amplitude and energy (suitably determined by an electrical characterization) is supplied to the phase-change memory cells in order to form small volumes of amorphous material (so called "amorphous caps") at an interface between respective phase change regions and heaters. Then, low-resistance crystalline conductive paths (or percolation paths), i.e., parallel current paths, are created through the high-resistance amorphous volumes of phase change material by providing appropriate sequences of set programming pulses, in order to program bits of the so called "parallel-type". An average cross-section of the conductive paths (and hence the resistance of the related memory element and the programmed state thereof) are determined by controlling the width, amplitude and/or number of pulses in each sequence. Program and verify algorithms are used in order to determine when the read current in the memory cell reaches a desired level (indicative of a reached "programmed state"). In particular, the programming current is increased at predefined steps and programming is interrupted when a suitable cross-section of the conductive path is reached, generating the desired read current level.

BRIEF SUMMARY

One embodiment is a method for multilevel programming of a phase change memory cell, which is free from the above-described drawbacks and limitations.

According to the present disclosure, a method for multi-level programming of a phase change memory cell and a phase change memory device are provided, as claimed in claims 1 and 12, respectively.

BRIEF DESCRIPTION OF THE SEVERAL VIEWS OF THE DRAWINGS

For the understanding of the present disclosure, some embodiments thereof will now be described, purely as non-limitative examples, with reference to the enclosed drawings, wherein.

DETAILED DESCRIPTION

In co-pending U.S. patent application Ser. No. 11/904,306 filed by the same Applicant on Sep. 26, 2007, an improved method for multilevel programming of memory cells has been proposed, wherein resistance levels associated with programmed states of the phase-change memory cells are also determined by controlling the length of the crystalline conductive path formed through the amorphous caps, so that conductive paths corresponding to different intermediate programmed states have different predefined lengths. Indeed, the resistance level of the programmed states is determined by the resistance of the conductive path, given by R=ρL/S (where R is the resultant resistance, ρ is the resistivity of the phase change material, and L and S are the length and the average cross-section, respectively, of the crystalline conductive path). While the cross-section of the conductive path is controlled by applying appropriate sequences of set pulses through the amorphous cap to convert desired portions of amorphous phase change material into crystalline phase change material, the length of the conductive path is controlled by forming amorphous caps of appropriate volume and thickness (or height) by applying appropriate reset pulses.

To reach each programmed state, a suitable reset pulse is applied, having predefined amplitude and energy levels, which allows to place the distribution of memory cells at the desired reading current value. In particular, such reset pulse causes the formation of a memory element having a region of amorphous material with a height (corresponding to a length of the subsequently formed crystalline conductive path) h±Δh, where Δh represents a variable contribution due to the dispersion of the heater and cell characteristics as well as to the dispersion of operating and environmental conditions. Program and verify algorithms then envisage the application of a number of set pulses such that the resulting cross-section of the crystalline conductive path is S±ΔS, where ΔS represents a variable contribution which allows compensating for an increase/decrease in the height of the region of amorphous material with a widening/reduction (with respect to a typical value) of the conductive path cross-section, so that memory cells are formed having conductive paths with different geometrical properties, but having a substantially similar resistance value.

The possibility to apply a predefined reset pulse specific for a given programmed state allows applying a smaller number of set pulses (during the subsequent program and verify operations), having a smaller range of values, so that the phase change material regions are subjected to lower stresses and more stable programmed states may be obtained.

The present Applicant has realized that the above programming methods, although advantageous in many respects, still suffer from some drawbacks and potential performance issues.

Figure 1:
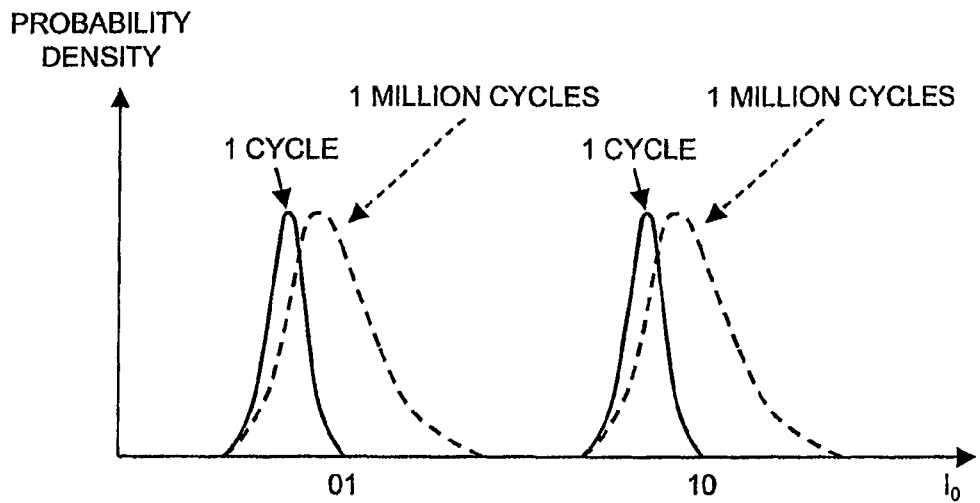
FIGS. 1 and 2 are plots of electrical quantities associated to known multilevel programming methods.

In particular, the Applicant has verified that, after several programming cycles, the phase-change memory cells are subject to a certain degree of degradation, and use increasingly higher programming current/voltage values to achieve the desired reading current levels. This behavior entails that the predefined values initially determined for the positioning of the memory cell distributions may not be the optimal values after many programming cycles, and that undesired tails may appear in such cell distributions. For example, FIG. 1 shows the cell distributions relating to two different intermediate programmed states (e.g., a '01' and '10' programmed states), after one programming cycle (solid line) and after a plurality, e.g., one million, of cycles (dotted line). It is apparent that after several programming cycles the distributions of cells become wider and tails appear, which may result in reading errors.

Figure 2:
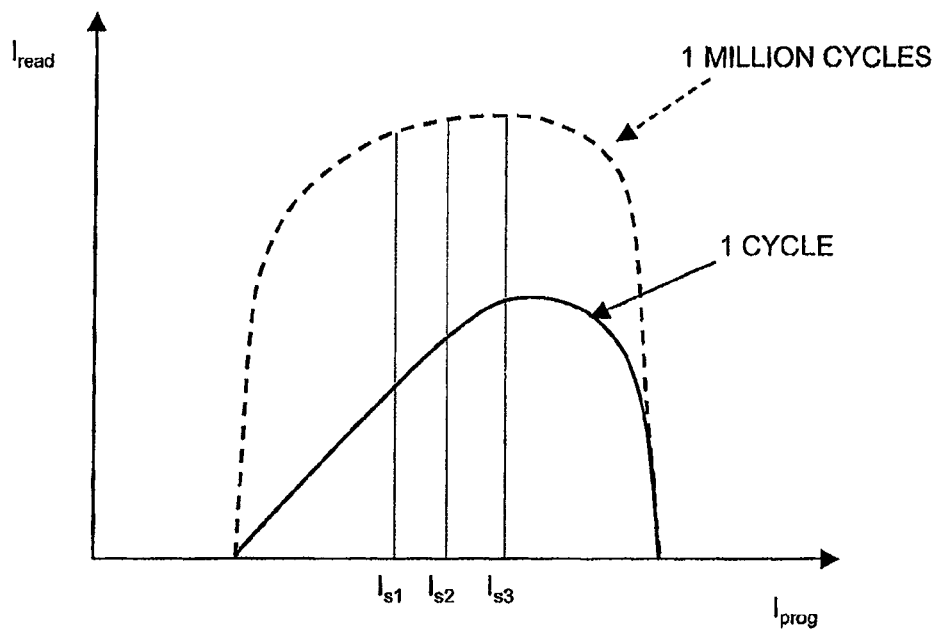

Indeed, it has been verified that, due to changes occurring in the electrical and physical characteristics of the memory cells after program cycling, the application of similar programming electrical quantities may lead to different plots of the reading current ($I_{read}$) with respect to the programming current ($I_{prog}$), as shown in FIG. 2 where the plot corresponding to one cycle is depicted with a solid line, while the plot corresponding to one million of cycles is depicted with a dotted line. In particular, even if the same values ($I_{S1}$, $I_{S2}$, $I_{S3}$ . . . ) are used during programming for the set current pulses, different values for the reading current are obtained, due to the shifting of the memory cell electrical characteristic after performing several programming cycles. Clearly, this behavior may cause erroneous readings of the content of the memory cells.

In the following description, reference will be made to the case in which current pulses are used to program PCM cells, and current levels are used to read the content of the same PCM cells. However, it is clear that all the concepts and solutions that will be described herein may also be applied to the case in which voltage pulses and voltage levels are used for programming and reading operations.

Figure 3:
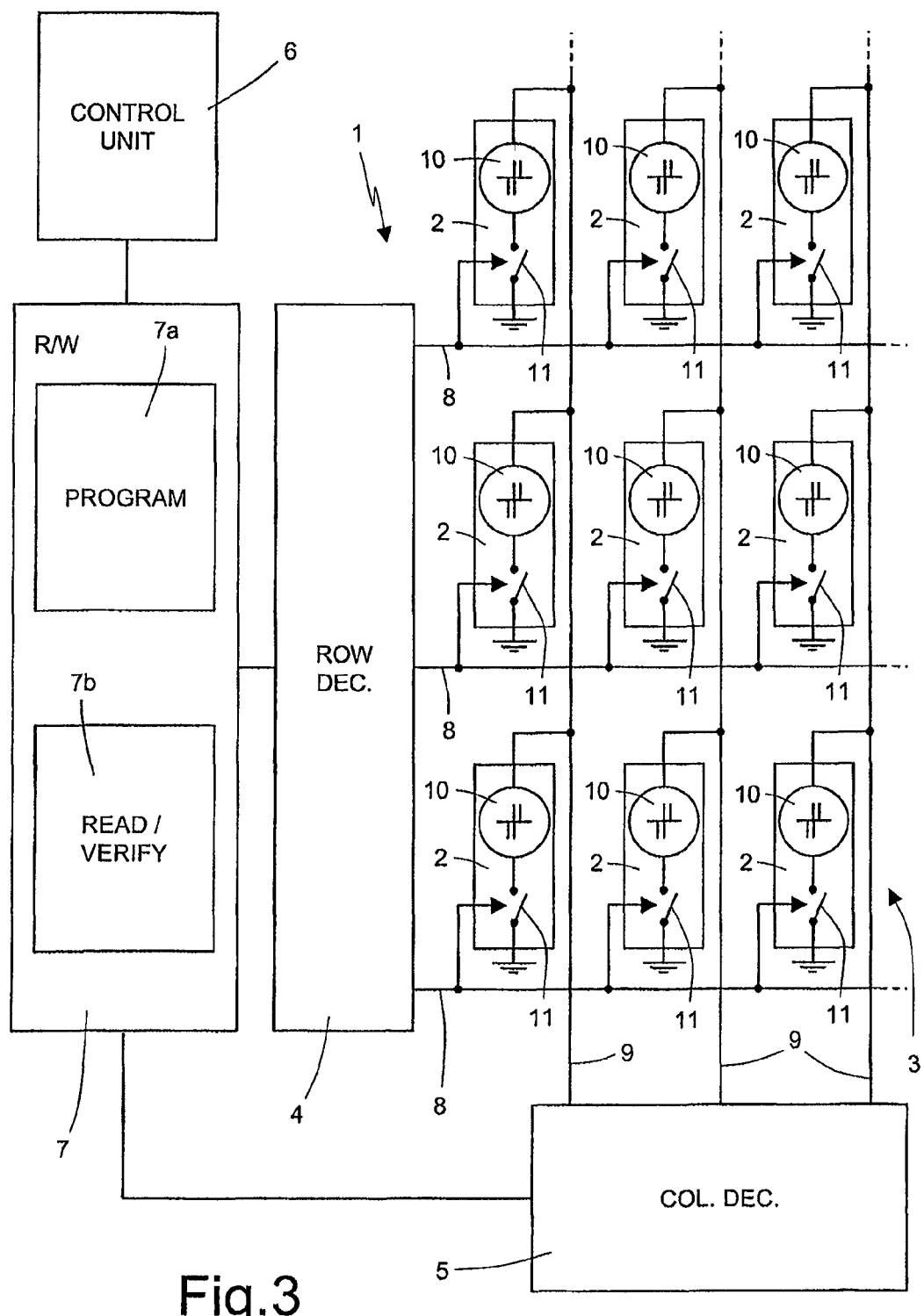
FIG. 3 is a simplified block diagram of a phase change memory device according to one embodiment of the present disclosure.

FIG. 3 shows a phase change memory ("PCM" hereinafter) device 1. A plurality of PCM cells 2 are arranged in rows and columns to form an array 3. A row decoder 4 and a column decoder 5 are coupled to a control unit 6 and to a read/program unit 7, which includes a program circuit 7a and a read/verify circuit 7b. Word lines 8 and bit lines 9 run parallel to rows and columns, respectively, and are selectively connectable to the read/program unit 7 through the row decoder 4 and the column decoder 5, in a known manner.

Each PCM cell 2 is connected at a cross-point of a respective word line 8 and a respective bit line 9 and includes a storage element 10, of the phase change type, and a selection element 11. The storage element 10 has a first terminal connected to the respective bit line 9 and a second terminal connected to a first terminal of the selection element 11. The selection element 11 has a second terminal grounded and a control terminal connected to the respective word line 8. According to alternative solutions, the storage element 10 and the selection element 11 of each PCM cell 2 may be exchanged in position; moreover, the selection elements 11 may have two terminals only (e.g., in the case of diodes).

The program circuit 7a is configured to provide programming pulses (set or reset pulses) to selected PCM cells 2, according to a programming method that will be described below. The read/verify circuit 7b is connected to the selected PCM cells 2 for reading the information stored therein (e.g., to implement a verify operation after each programming pulse). In one embodiment, the read/verify circuit 7b is configured to carry out current reading of the PCM cells 2, i.e., output currents from suitably biased PCM cells 2 are compared to appropriate read current reference levels (during a conventional reading) or to program current reference levels (during a verify operation).

Figure 4:
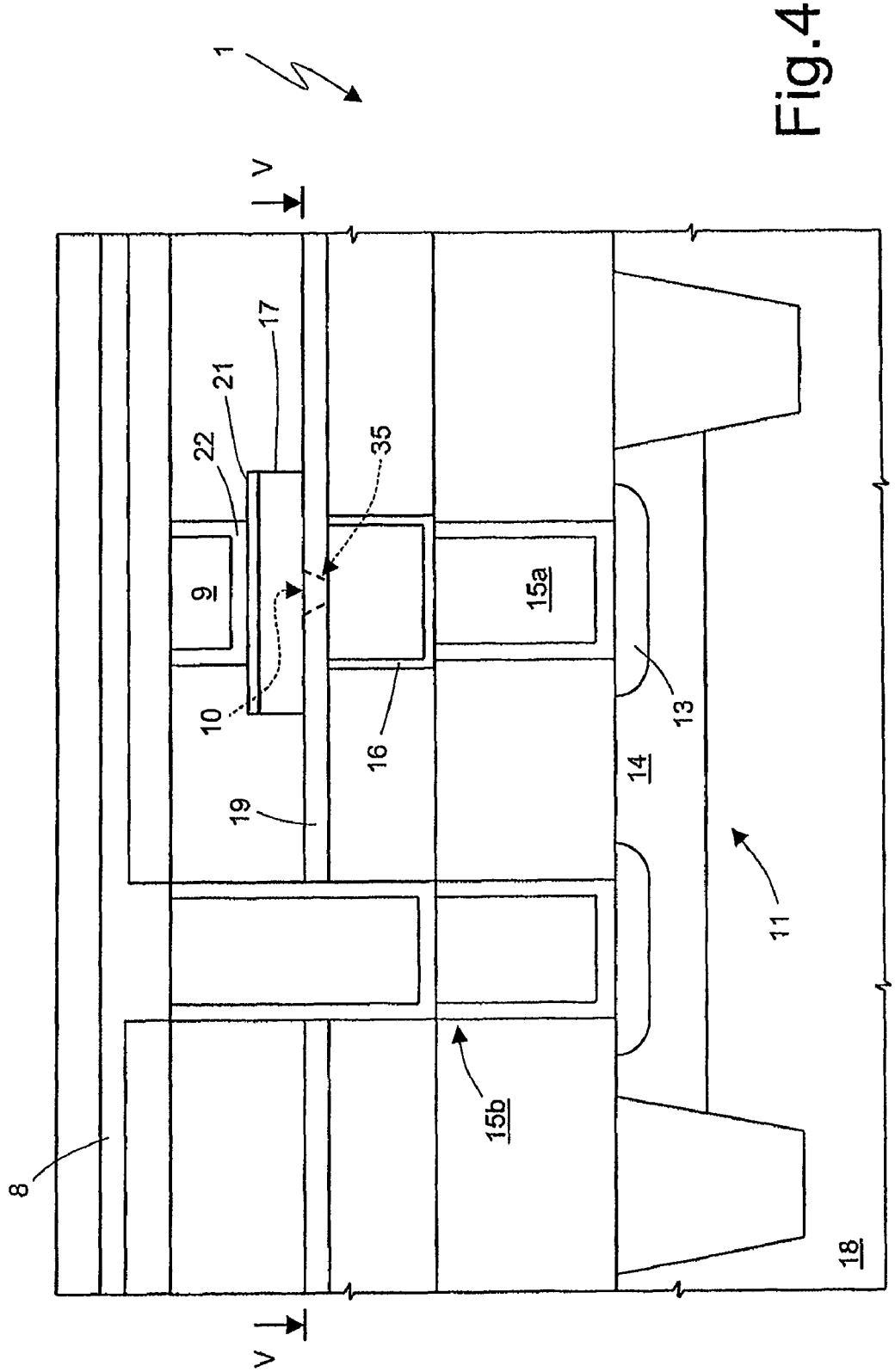
FIG. 4 is a cross-section through a portion of the phase change memory device of FIG. 3.

An exemplary cross-section of a PCM cell 2 is illustrated in FIG. 4 (in which only the parts useful for the understanding of the present disclosure will be summarily described), wherein the selection element 11 is a PNP bipolar transistor having an emitter region 13, a base region 14 and emitter and base contacts 15a, 15b (it should be clear, however, that in other embodiments different selection elements may be used, such as NPN bipolar transistors, MOS transistors or diodes). An intrinsic collector of the selection element 11 is formed in a semiconductor substrate 18, wherein the whole array 3 is integrated.

Figure 5:
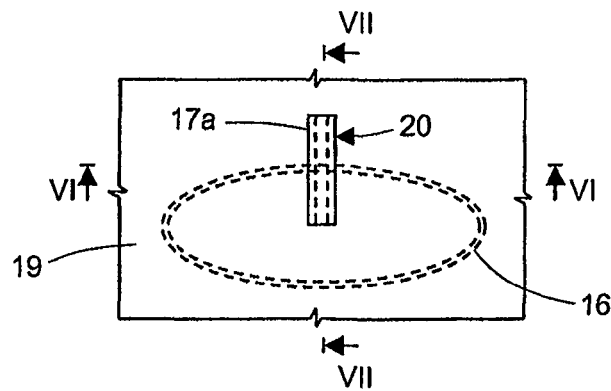
FIG. 5 is a top plan view, with part removed for clarity, of a particular of the device of FIG. 4, taken along the line V-V of FIG. 4.
Figure 6:
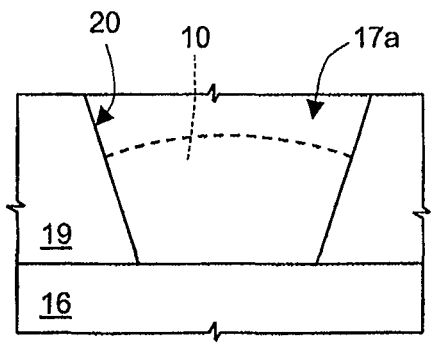
FIG. 6 is a cross-section of an enlarged detail of the device of FIG. 4 taken along the line VI-VI of FIG. 5.
Figure 7:
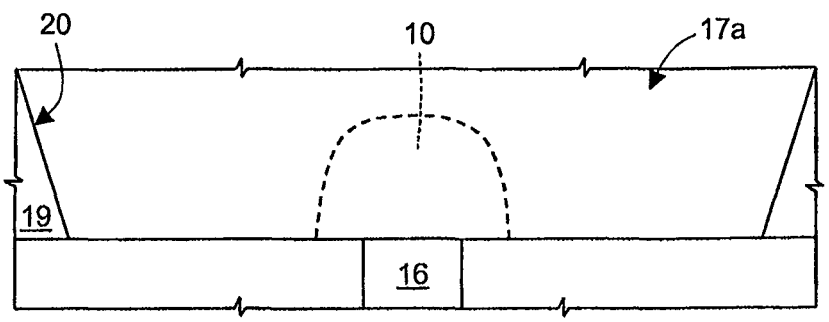
FIG. 7 is a cross-section of an enlarged detail of the device of FIG. 4 taken along the line VII-VII of FIG. 5.

A cup-shaped heating element 16 is formed on the emitter contact 15a. An upper portion of the heating element is defined by a circular or oval side wall having sublithographic thickness, as also shown in FIG. 5. Here, the term "sublithographic" means a linear dimension smaller than the minimum dimension achievable with current optical (UV) lithographic techniques, and hence smaller than 100 nm, preferably 50-60 nm, down to approximately 5-20 nm. A strip 17 of a crystalline chalcogenic material, e.g., GST, runs parallel to the bit lines 9 and is separated from the heating element 16 by a layer 19 (e.g., of nitride material). The strip 17 may be made by a high-temperature deposition process, in order to make sure that it is in the crystalline state. Additionally, first and second protective layers 21, 22 are positioned between, and parallel to, the strip 17 and bit lines 9. An elongated microtrench 20 (see FIG. 5) is formed through the layer 19 above and across the heating element 16 in a direction parallel to the bit lines 9. Thus, a thin portion 17a of the strip 17 fills the microtrench 20 and contacts the heating element 16, as shown in FIGS. 6 and 7. Downwardly, the microtrench 20 has a sublithographic width in a direction parallel to the word lines 8, so that a contact area between the thin portion 17a of the strip 17 and the heating element 16 has sublithographic extension. The storage element 10 of the PCM cell 2 is formed in the thin portion 17a of the strip 17 at the contact area with the heating element 16. On account of the sublithographic extension of the contact area, even relatively small currents flowing through the strip 17 and the heating element 16 will provide sufficient heating by Joule effect to cause phase transitions in a volume corresponding to the storage element 10. However, phase transitions are confined to a small volume within the microtrench 20 and around the contact area of the thin portion 17a and the heating element 16, while the reminder of the strip 17 does not switch from the low-resistance crystalline state. Outside the microtrench 20, in fact, current density is not high enough to heat the phase change material above the switch temperature and the crystalline state is therefore preserved.

Figure 8:
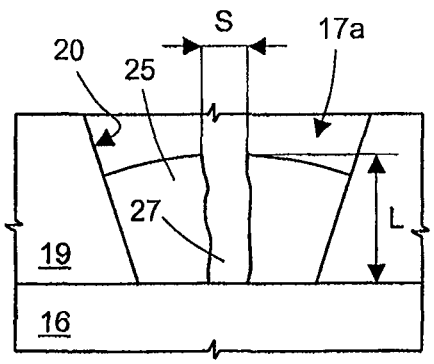
FIG. 8 shows the same view as FIG. 6, in an intermediate programmed state.

Information stored in PCM cells 2 are associated with resistance levels (programmed states) associated to the storage elements 10. In particular (as shown in FIG. 8), the resistance level depends on the presence or the absence of a volume of amorphous phase change material (amorphous cap 25) at the interface of the heating element 16 and the thin portion 17a of the strip 17; the presence or the absence of a crystalline conductive path 27 through the amorphous cap 25; the size of this conductive path 27, in particular in terms of the cross-section S and length L thereof.

According to a particular aspect of the present disclosure, a multilevel programming algorithm is proposed envisaging to provide each phase change memory cell with an adaptive reset, i.e., to dynamically and iteratively adapt the value (in terms, e.g., of voltage/current amplitude and time duration) of the reset pulses to the electrical and physical characteristics of the memory cells to be programmed, in order to find the minimum reset pulse which allows to program the memory cell in each desired programmed state and level of current/voltage (or at least the reset pulse with the lowest possible value in a given sequence of values). This algorithm exploits the property of the phase change memory cells according to which, to different reset pulse values, different values of the set pulses can be associated that are able to program the cell into the desired programmed state, e.g., by modulating the cross-section S of the conductive path 27 to take into account the different length L thereof. In other words, a different $I_{read}/I_{prog}$ characteristic curve, along which suitable set pulse values may be found giving a desired read current, is associated to each reset pulse value (and corresponding length L of the conductive path 27).

The operation of the proposed algorithm will be described with specific reference to an exemplary embodiment according to which four different states may be programmed in each memory cell, so that two bits may be stored in each cell. It is however to be understood that any different number of programmed states may be envisaged (e.g., 8 and 16 levels for storing 3 and 4 bits, respectively). In this specific example, bit values '00', '01', '10' and '11' are assigned to respective (decreasing) resistance levels and (increasing) reading currents $I_{rad}$ from the suitably biased PCM cells.

Figure 9:
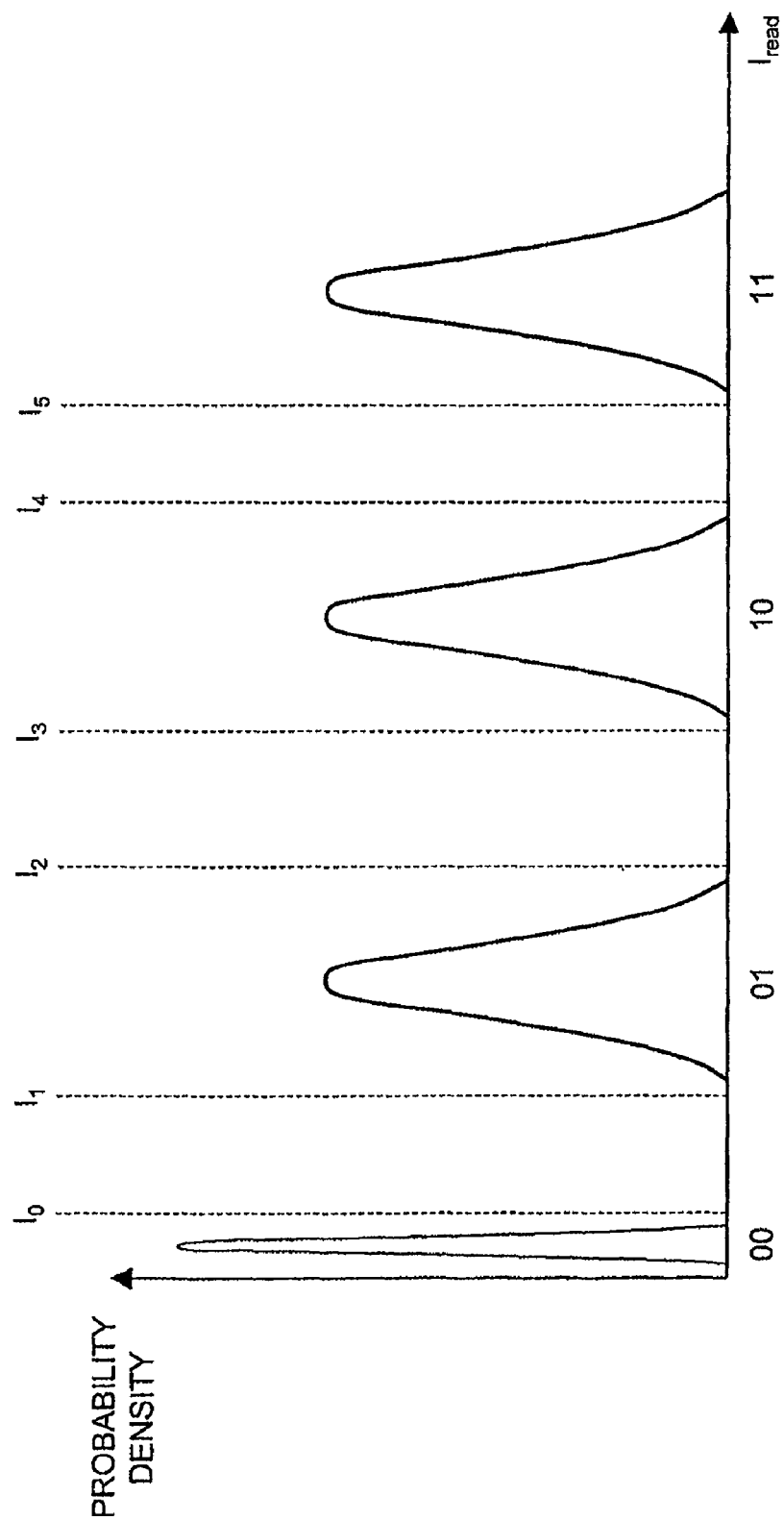
FIG. 9 shows a distribution of currents in different programmed states of a PCM cell in the device of FIG. 3.

As illustrated in FIG. 9, showing the memory cell distributions associated to each programmed state, bit value '00' is assigned to a fully reset programmed state, in which the resistance level is the highest and the reading current $I_{read}$ is correspondingly the lowest, in particular lower than a value $I_0$; in this condition an amorphous cap 25 is formed, that is not crossed by any crystalline conductive path. Bit values '01' and '10' are associated to a first and a second intermediate programmed state, having decreasing resistance levels and increasing output currents $I_o$; the conductive path 27 is formed through the amorphous cap 25, having an overall value of resistance R (modulated by controlling both the length L and cross-section S thereof), which is lower in the second intermediate programmed state with respect to the first one. In particular, the reading current $I_{read}$ in the first intermediate programmed state is comprised between values $I_1$ and $I_2$, with $I_2>I_1>I_0$; and the output current $I_{read}$ in the second intermediate programmed state is comprised between values $I_3$ and $I_4$, with $I_4>I_3>I_2$. A fully set programmed state, in which all the phase change material forming the storage element 10 is crystalline, is associated with the bit value '11'. In this programmed state, the resistance level is the lowest and the output reading current $I_{read}$ is the highest, in particular higher than a value $I_5$, with $I_5>I_4$. Of course, in use, several PCM cells 2 are brought in respective programmed states, so that, for example, some PCM cells 2 may be in the first intermediate programmed state, while other PCM cells 2 may at a same time be in the second intermediate programmed state.

Figure 10A:
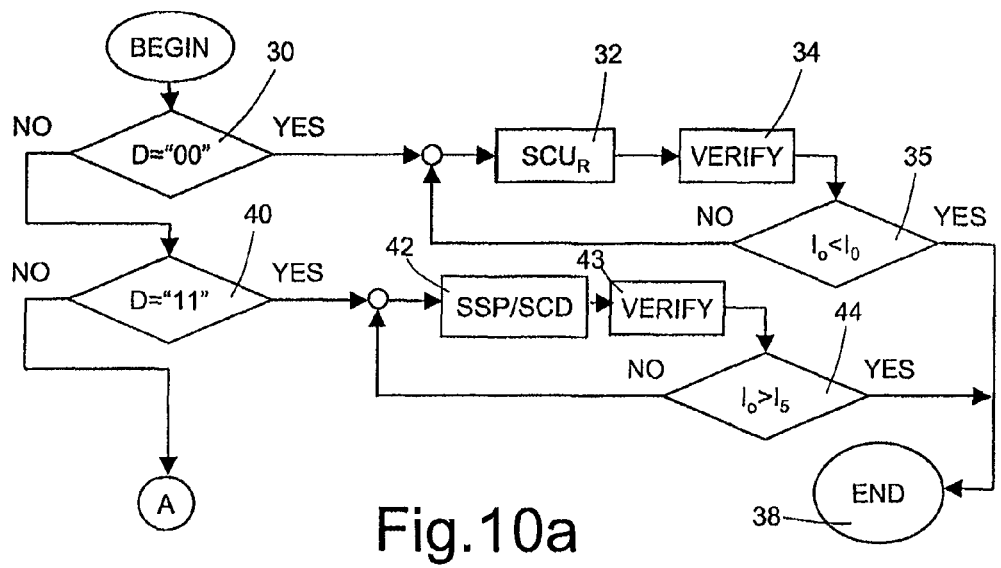
FIGS. 10a and 10b are flowcharts relating to a method for multilevel programming of phase change memory cells according to one embodiment of the present disclosure.

The control unit 6 drives the program circuit 7a and the read/verify circuit 7b to program selected PCM cells 2 according to the multilevel programming method hereinafter described with reference also to FIGS. 10a and 10b.

Figure 11:
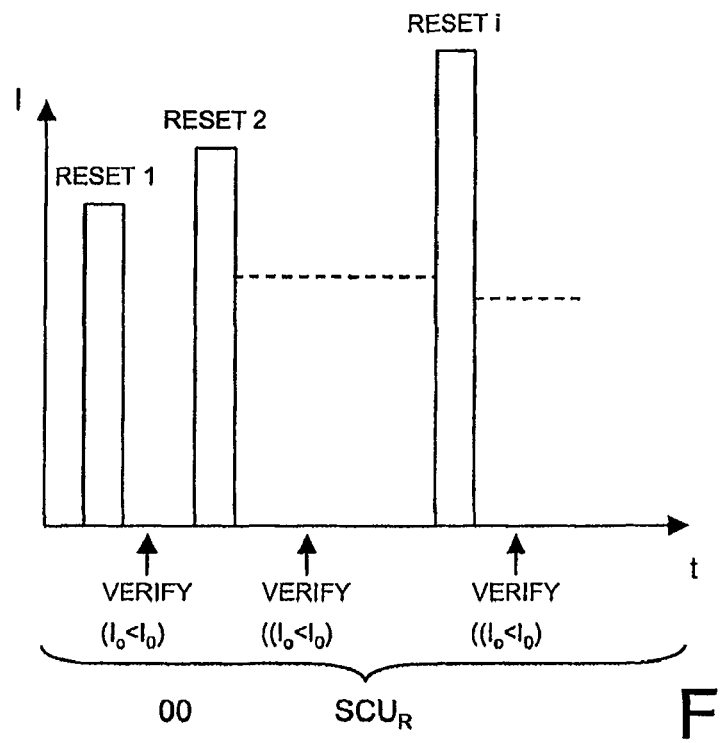
FIG. 11 is a plot showing exemplary reset programming pulses used in the method of FIGS. 10a, 10b for programming a fully reset state.

In a decision block 30 (see FIG. 10a), a determination is made whether the data D to be stored in the PCM cell 2 is '00', that is the fully reset programmed state. If this is the case, the control unit 6 controls the program circuit 7a in order to apply the lowest reset pulse that is able to associate an output current $I_o<I_0$ to the PCM cell 2, initiating a so called "Reset Program & Verify SCU (Stair Case Up)" sequence (denoted with $SCU_R$). Accordingly (see also FIG. 11), a sequence of reset pulses $Reset_i$ with increasing level is applied, and, after each reset pulse, a verify operation is executed in order to determine if the output current associated to the PCM cell 2 has become lower than the desired value $I_0$.

In detail, in a process step 32 a reset pulse (in particular a first reset pulse $Reset_1$) is applied, having a minimum amplitude (the value of which may be, for instance, determined in a preliminary characterization process or chosen at the design level).

The programmed state of the PCM cell 2 is then verified by the verify circuit 7b in a process block 34, wherein the PCM cell 2 is read, and in a decision block 35, wherein the output current $I_o$ read from the cell is compared to the desired value $I_0$. If the output current $I_o$ is still higher than $I_0$, the reset staircase up pulse sequence $SCU_R$ is continued in processing block 32 by applying a second reset pulse $Reset_2$, having an amplitude increased by a given reset increase gradient $\Delta I_{R1}$ with respect to the first reset pulse $Reset_1$ (the reset increase gradient $\Delta I_{R1}$ may again be determined, for instance, at the characterization phase or the design stage). Subsequently, another verify operation is carried out by the verify circuit in processing block 34 and decision block 35. Program/verify loops are then repeated until the output current $I_o$ becomes lower than $I_0$. At this time, the programming cycle for reaching the level '00' is terminated (block 38). In each program/verify loop, the amplitude of the new reset pulse $Reset_i$ is increased by a reset increase gradient $\Delta I_{Ri}$ with respect to the previous reset pulse $Reset_{i-1}$ in the sequence.

Figure 12:
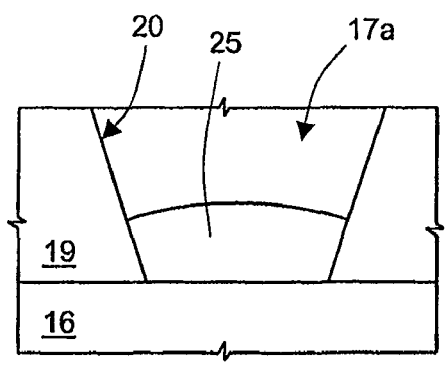
FIGS. 12 and 13 show the same view as FIG. 6, in a fully reset and fully set programmed state, respectively.

This algorithm thus allows applying the lowest possible reset pulse $Reset_i$ to each PCM cell 2, so that memory cells that are reset at a lower current receive reset pulses with lower levels with respect to the memory cells that are reset at higher currents, but still being able to form an amorphous cap 25 with suitable size (and hence a stable bit) without generating excessive temperatures that would cause a degradation during program cycling. In the fully reset programmed state '00', the amorphous cap 25, as shown in FIG. 12, completely covers the interface between the heating element 16 and the thin portion 17a of the strip 17, and has a thickness (or height) corresponding to the reset pulse that has been adaptively and dynamically determined during the programming operations.

Figure 13:
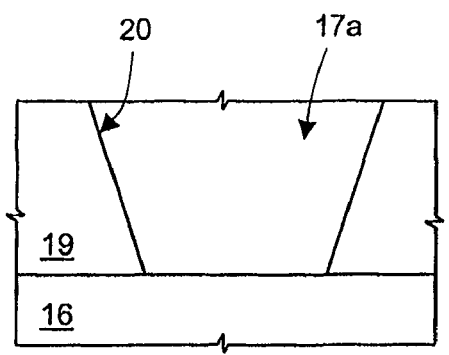
Figure 14A:
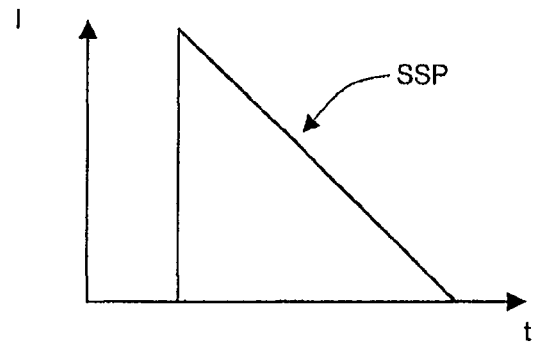
FIGS. 14a and 14b are plots showing exemplary set signals usable in the method of FIGS. 10a, 10b.
Figure 14B:
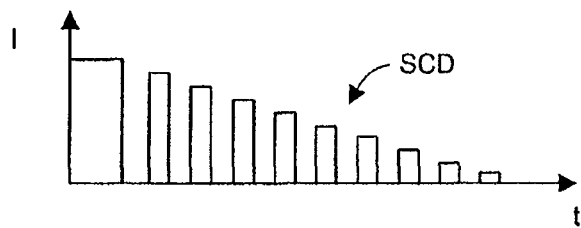

In a decision block 40 (see again FIG. 10a), determination is made whether the data D to be stored in the PCM cell 2 is '11', that is the fully set programmed state. If this is the case, in a process block 42 the control unit 6 controls the program circuit 7a in order to apply the minimum set pulse that allows to crystallize the entire volume of amorphous material generated by the previous programming operations (if any), as shown in FIG. 13. In particular, a full-set current pulse is applied in the form of a so-called Set Sweep Pulse (SSP, see FIG. 14a), or Staircase Down (SCD, see FIG. 14b), that allows fast heating and slow cooling of the phase change material forming the storage element 10. In such a way, the "window" available for positioning the intermediate programmed states (ranging from 0 µA to the current associated to the fully crystallized state) is maximized, since the application of a slowly decreasing ramp allows to obtain a crystalline state for the phase change material with the minimum resistance value (and, hence, the maximum current level) for the '11' state, thereby maximizing the spacing between the '00' and the '11' states.

A verify operation may be carried out after block 42, in processing block 43 and decision block 44, in order to verify if the output current $I_o$ has exceeded value $I_5$ ($I_o > I_5$); if this is not the case, further Set Sweep Pulse or Staircase Down set pulses are iteratively applied (e.g., having a different duration or a different starting point), until the above condition $I_o > I_5$ is verified and the '11' state is reached.

Figure 10B:
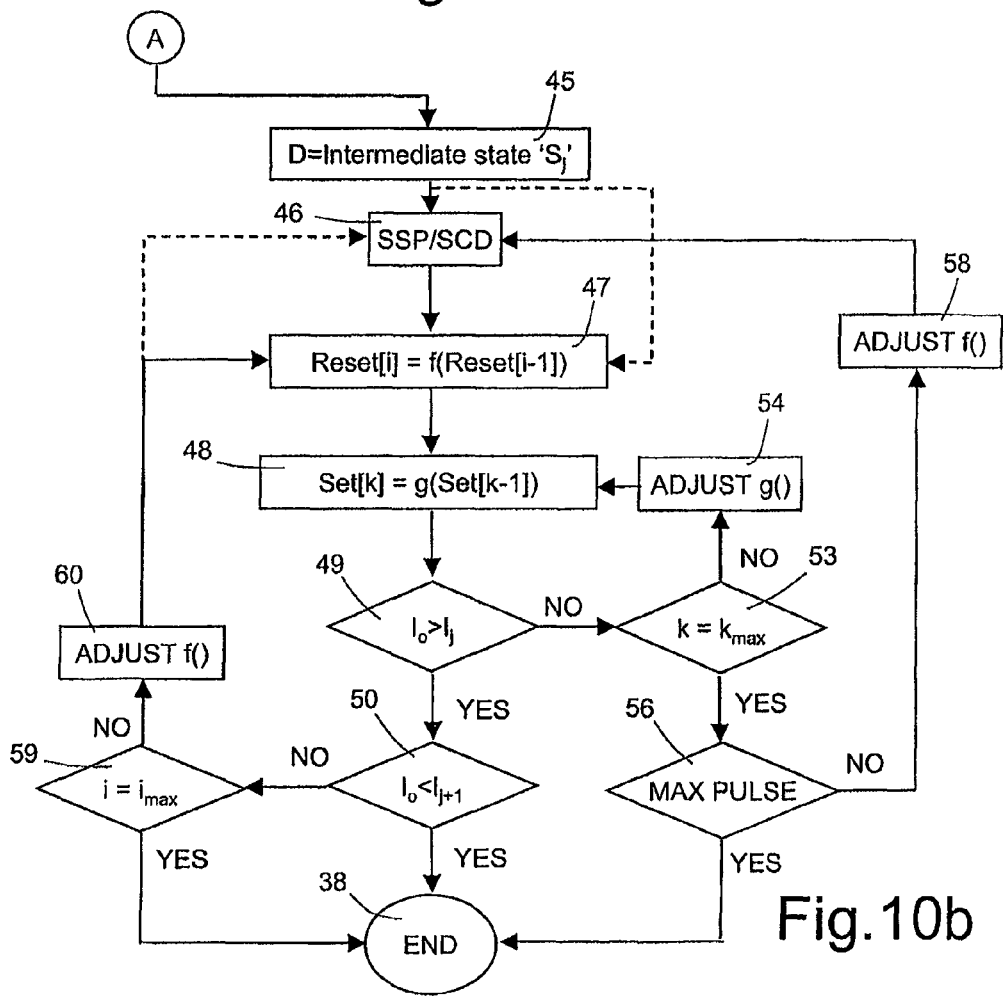

With reference to FIG. 10b, the iterative algorithm carried out for programming the PCM cells 2 into intermediate states between the fully reset and the fully set states (in the four bit example, the '01' and '10' intermediate states) will now be described. In general terms, this algorithm envisages: applying to each PCM cell 2 a sequence of reset pulses $Reset_i$, wherein each reset pulse is determined iteratively as a first function f (in the following "reset function") of the previously determined reset pulse in the sequence; and, for each one of the reset pulses $Reset_i$, applying a sequence of set pulses $Set_k$, wherein each set pulse is determined iteratively as a second function g (in the following "set function") of the previously determined set pulse in the sequence. The nested iterative reset and set sequences are interrupted when it is determined that a desired state has been programmed in the PCM cell 2. As will be explained in detail, the above algorithm also envisages suitably adjusting the reset and set functions f, g during the iterative sequences.

In greater detail, in a process block 45, a determination is made whether the data D to be stored in the selected PCM cell 2 is the intermediate logic level '$S_j$', associated to the $j^{th}$ intermediate programmed state (e.g., the '01' or '10' intermediate state in the four bit example).

If this is the case, in a process block 46 the program circuit 7a is controlled to apply a Set Sweep Pulse (SSP), or a Staircase Down (SCD), in order to initially place in a fully set state the phase change material (please note that at a first iteration of the programming algorithm, process block 46 may be skipped as shown by the optional branch in dotted line, reaching the following process block 47).

Subsequently, in process block 47, the value of the present reset pulse $Reset_i$ (e.g., a current pulse) that is to be applied to the PCM cell 2 is iteratively determined as the output of the reset function f applied to the previous reset pulse $Reset_{i-1}$, that was determined at the previous iteration of the algorithm, i.e.:

$$Reset[i] = f(Reset[i-1])$$

For example, the reset function f may envisage an amplitude increase $\Delta I$, or an increase of the pulse duration $\Delta t$, or even a shape modification, with respect to the previously applied reset pulse $Reset_{i-1}$. In the example depicted in FIG. 15A, the reset pulses $Reset_i$ in the sequence have increasing-amplitude current levels.

Figure 15A:
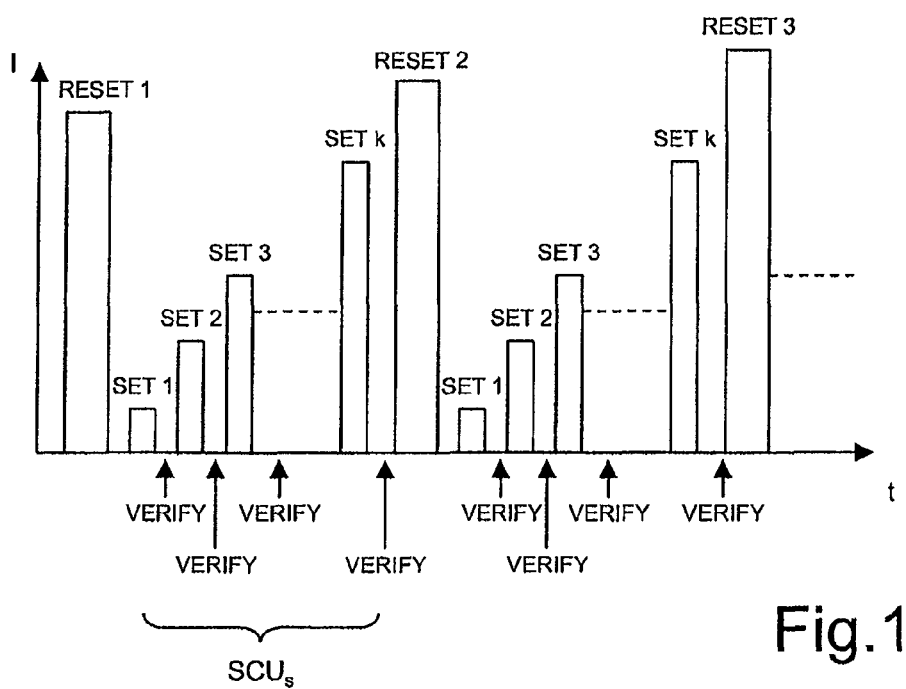
FIGS. 15A and 15B are plots showing exemplary set and reset programming pulses used in the method of FIGS. 10a, 10b for programming an intermediate programmed state.
Figure 16:
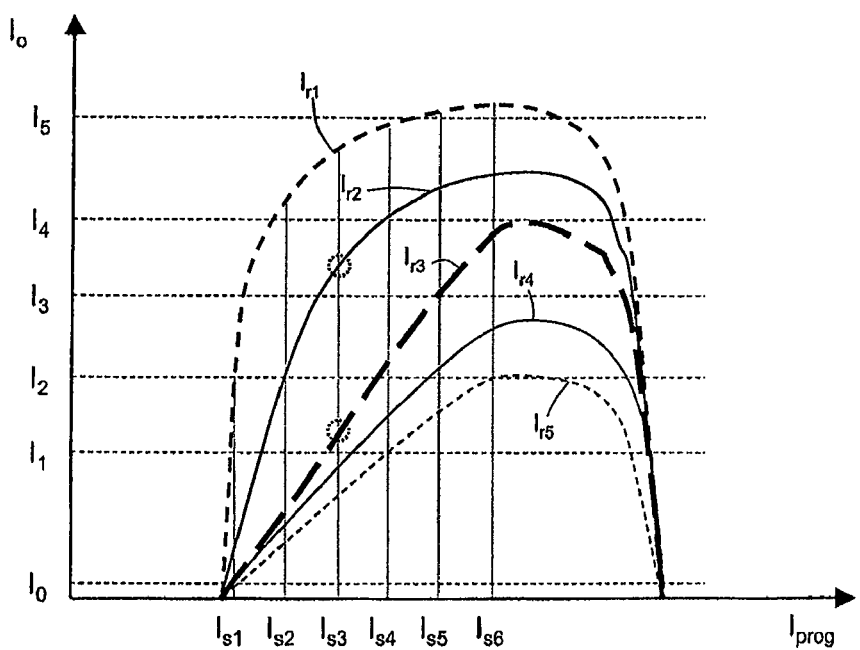
FIGS. 16 and 17a, 17b are plots showing programming characteristic curves of PCM cells in the device of FIG. 3.

At the first iteration of the algorithm, a first reset pulse $Reset_1$ is applied (see the exemplary embodiment depicted in FIG. 15A) with a first reset current $I_{r1}$, in order to form an amorphous cap 25 with a first given height (as a function of the applied reset current) that is sufficiently stable if a bake operation is carried out; a first programming characteristic curve is associated to this first reset pulse, as shown in FIG. 16. The first reset pulse $Reset_1$ may have a minimum amplitude value (which is determined in a characterization process or at the design stage).

Once the amorphous cap 25 has been obtained, the low-resistance conductive path 27 is formed therethrough, having a first length $L_1$ (approximately equal to the thickness of the amorphous cap 25) and a cross-section S that is controlled by applying a sequence of set pulses $Set_k$, and verifying, after each set pulse, if the $j^{th}$ intermediate programmed state has been set (e.g., by verifying if the output current from the memory cell is comprised between desired values $I_j$ and $I_{j+1}$ associated to the $j^{th}$ intermediate programmed state, $I_j$ being a lower threshold and $I_{j+1}$ being an upper threshold for the $j^{th}$ intermediate state).

In greater detail, in a processing block 48 the present value of the set pulse $Set_k$ (e.g., a current pulse) that is to be applied to the PCM cell 2 is iteratively determined, as the output of the set function g applied to the previous set pulse $Set_{k-1}$, that was determined at the previous iteration of the algorithm, i.e.:

$$Set[k]=g(Set[k-1])$$

For example, the set function g may envisage an amplitude increase $\Delta I$, or an increase of the pulse duration $\Delta t$, or even a shape modification of the applied pulse, with respect to the previous set pulse $Set_{k-1}$. In the example depicted in FIG. 15A, the sequence of set pulses has the pattern of a "Set Program & Verify SCU" (denoted with $SCU_S$), with set pulses having increasing current levels (the value of which may be, for instance, determined in a preliminary characterization process or chosen at the design level). At the first iteration of the algorithm, a first set pulse $Set_1$ is applied, e.g., having a minimum current amplitude $I_{s1}$, which generates a conductive path 27 having a first cross-section $S_1$.

The programmed state of the PCM cell 2 is then verified by the verify circuit 7b in a process block 49, wherein the PCM cell 2 is read and the output current $I_o$ is first compared with the lower threshold $I_j$.

If the output current $I_o$ is greater than the lower threshold $I_j$, and it is also determined, in a subsequent process block 50, that the output current $I_o$ is also lower than the upper threshold $I_{j+1}$, then the programming operation to the $j^{th}$ intermediate programmed state is considered successful and the programming cycle is terminated (block 38).

If in process block 49 it is determined that the output current $I_o$ is not higher than the lower threshold $I_j$, the algorithm continues to process block 53, where it is judged if a maximum number $k_{max}$ of set pulses has already been applied (the relation $1<k<k_{max}$ thus being valid for the set index k). If this is not the case, the algorithm returns to process block 48, for the generation of a new set pulse $Set_{k+1}$, e.g., increased with respect to the first set pulse $Set_k$ of a given set increase gradient $\Delta I_{Sk}$ determined by the set function g. For example, a second set pulse $Set_2$ having an amplitude $I_{s2}$ increased with respect to the first set pulse $Set_1$ (of a given set increase gradient $\Delta I_{S1}$) is generated, and a conductive path 27 having a higher cross-section $S_2$ is thus formed in the amorphous cap 25.

However, before returning to process block 48, the algorithm passes through process block 54, where the set function g may be adjusted. For example, a different value for the set increase gradient $\Delta I_{Sk}$ may be implemented, or, in certain operating conditions, the set function g may be adjusted to produce a decrease of the next set pulse $Set_{k+1}$ with respect to the previous one (or a different increase/decrease of the pulse duration $\Delta t$ or even a modification of the shape of the applied pulses may be implemented (See e.g., FIG. 15B).

If in process block 53 it is determined that the maximum number $k_{max}$ has been reached (i.e., the whole sequence of set pulses $Set_k$ has not allowed to reach the desired programmed state), it is first judged, in process block 56, if a limit condition (denoted with "max pulse" in FIG. 10b) has already been reached (e.g., corresponding to a maximum programming pulse being reached for the memory cell). If this is the case, it is judged that the programming operation has not been successful and the programming cycle is terminated (block 38).

If this is not the case, the algorithm moves to block 58, where the reset function f is adjusted, and then back to process block 46. For example, the reset function f is modified in order to produce a decrease of the value (e.g., in terms of the amplitude and/or duration) of the next reset pulse $Reset_i$ with respect to the previous iteration, in order to obtain a different programming characteristic curve allowing to reach higher values for the output current $I_o$.

If in process block 50 it is instead determined that the output current $I_o$ is not lower than the upper threshold $I_{j+1}$, the algorithm proceeds to the iterative determination of a new reset pulse $Reset_{i+1}$ and a different programming characteristic curve allowing to reach different values for the output current $I_o$. However, it is first determined, process block 59, if a maximum number $i_{max}$ of reset pulses has already been applied (the relation $1<i<i_{max}$ thus being valid for the reset index i). If this is the case, the programming operation has not been successful and the programming cycle is terminated (block 38).

If this is not the case, the algorithm returns to process block 47, for the generation of a new reset pulse $Reset_{i+1}$, e.g., being increased with respect to the previous reset pulse $Reset_i$ of a given reset increase gradient $\Delta I_{Ri}$ determined by the reset function f. However, before returning to process block 46, the algorithm passes through process block 60, where the reset function f may be adjusted. The reset function f may be modified in order to produce a different increase of the value (e.g., in terms of the amplitude and/or duration) of the next reset pulse $Reset_{i+1}$, and to obtain a different programming characteristic curve allowing to reach lower values for the output current $I_o$ (or instead, a different increase/decrease of the pulse duration $\Delta t$ or even a modification of the shape of the applied pulses may be envisaged). As an alternative embodiment, and as shown by the optional branch in FIG. 10b, the process may return from block 60 to block 46, for the application of a new SSP or SCD set sequence.

For example, a second reset pulse $Reset_2$ with a second reset current $I_{r2}$ (increased with respect to the first reset pulse $Reset_1$ of a reset increase gradient $\Delta I_{R1}$) is generated, in order to form an amorphous cap 25 having a higher thickness allowing a greater length $L_2$ of the conductive path 27 to be achieved. A second programming characteristic curve is now exploited, associated to this second reset pulse $Reset_2$. As it is clear from FIG. 16, the application of the set pulses $Set_k$ along the different characteristic curve causes the generation of different values for the output current, which may now satisfy the required condition for programming the desired intermediate state. In particular, a slower slope of the programming curve results in general in a higher programming accuracy.

The two nested iterative loops associated to the reset and set sequences are so iterated until the suitable reset and set pulses are found which allow to program the PCM cell 2 in the desired intermediate programmed state. For example, in the exemplary embodiment shown in FIGS. 15A and 16, the third reset pulse $Reset_3$ (with the associated reset current $I_{r3}$ and characteristic curve) allows placing the PCM cell 2 in the programmed state '01', giving an output current satisfying the condition $I_1<I_o<I_2$ when a third set pulse $Set_3$ with current level $I_{s3}$ is applied; while the programmed state '10', with the output current satisfying the condition $I_3<I_o<I_4$, is reached with the second reset pulse $Reset_2$ and the third set pulse $Set_3$ in the sequences of reset and set programming pulses.

As is clear from FIG. 16, the desired programmed states may be obtained even with higher reset currents (see, e.g., the further characteristic curves associated to reset pulses $Reset_4$ and $Reset_5$). However, advantageously, the above algorithm determines the reset pulse allowing the PCM cell 2 to be programmed to the desired state, which has the minimum value in the sequence of reset pulses, thus minimizing programming stresses.

Figure 15B:
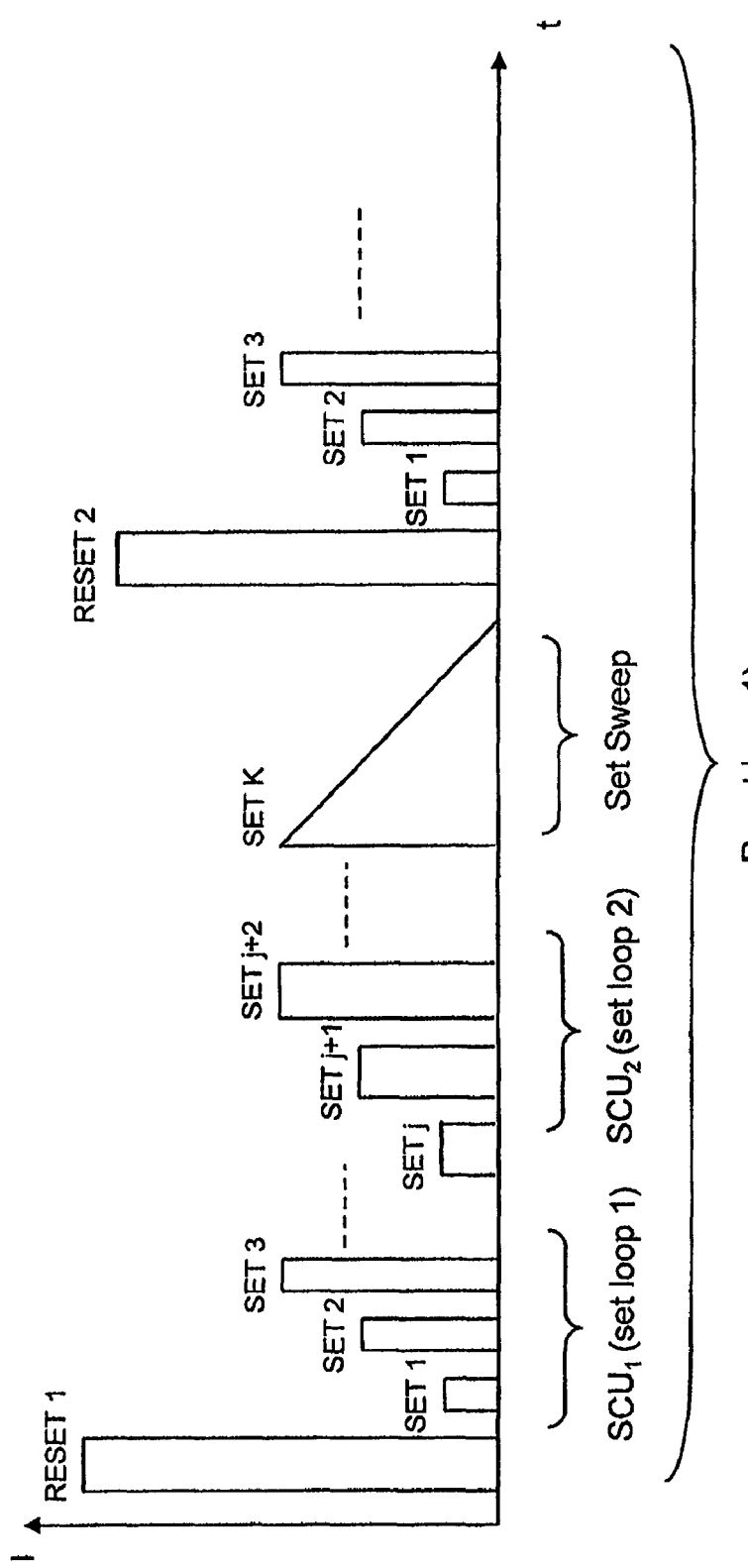

As discussed above, the set function g may be adjusted in step 54 to produce an increase or a decrease of the pulse duration Δt or even a modification of the shape of the applied pulses may be implemented. For example, FIG. 15B shows a first SCU sequence with pulses of increasing amplitude (set loop 1), followed by a second SCU sequences with pulses of the same increasing amplitudes as in set loop 1 and also with increasing pulse durations (set loop 2), followed by a single pulse of a different shape (e.g., SSP pulse). If the set sequences have not been able to program the cell to the desired level, an adjusted reset pulse (RESET 2) of a lower amplitude than the first reset pulse (RESET 1) can be applied, followed by one or more new sequences of set pulses. Of course, those skilled in the art will understand that the pulse sets of FIGS. 15A and 15B are only exemplary, and that both the set and reset pulses can be varied in amplitude, pulse duration, pulse shape, number, or in other ways without departing from the scope of the present disclosure.

As previously discussed, the set function g may be adjusted (see process block 54) for example by varying the value of the set increase gradient $\Delta I_{Sk}$ between two consecutive set pulses $Set_k$, $Set_{k+1}$, thus modulating the slope of the staircase-up sequence that may be associated to the set programming pulses. According to a particular embodiment of the present disclosure, the set increase gradient $\Delta I_{Sk}$ is modified, for example is decreased, when it is determined that the PCM cell 2 is near to the desired $j^{th}$ intermediate programmed state.

In detail, a further value to be sensed for the read current is introduced, $I_{xj}$, which is close to the lower threshold $I_j$ associated to the $j^{th}$ programmed state. For example, if the PCM cell 2 is to be placed in the first intermediate state (bit level '01'), the read current has to be comprised between the current levels $I_1$ and $I_2$; accordingly, a further current level is introduced having a value $I_{x1}$ close to, but still lower than, $I_1$. When, during a verify operation, the output current $I_o$ becomes higher than this further current value $I_{x1}$, the memory cell is determined to be close to the desired programmed state and the program circuit 7a is controlled to apply a smaller set increase gradient $\Delta I_{s2}$ (and a lower slope $\alpha_2$) between two consecutive set pulses, smaller than an initial gradient $\Delta I_{s1}$ and slope $\alpha_1$. In this manner, using smaller current increases, it is possible to more finely and closely place the PCM cells 2 in the desired programmed state.

Figure 17A:
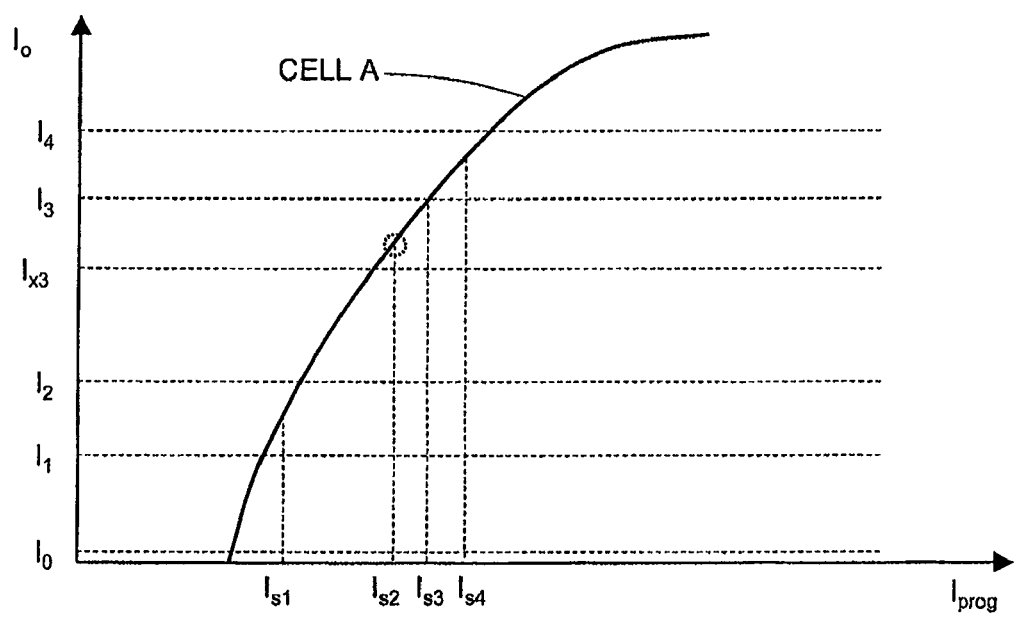
Figure 17B:
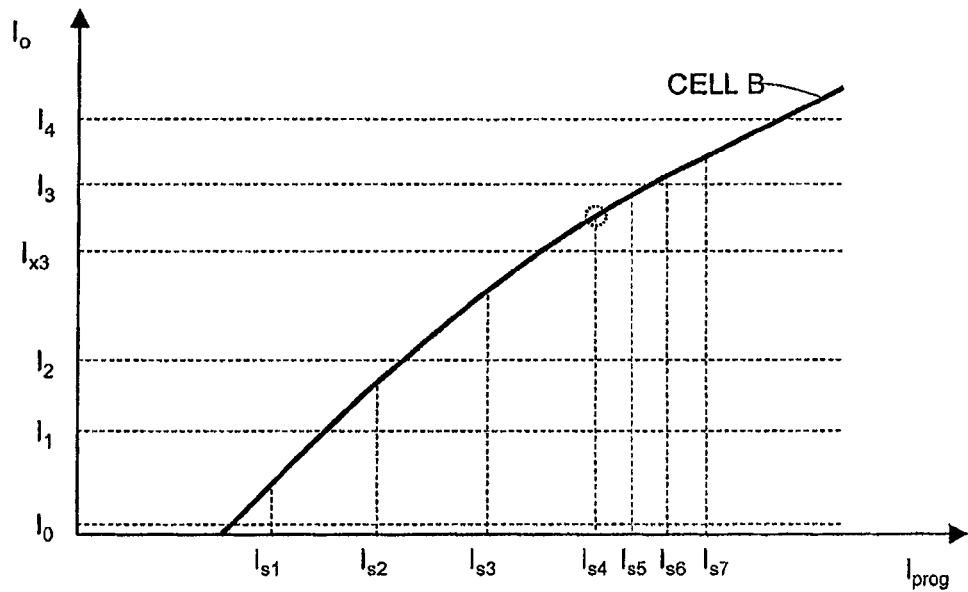

In detail, FIGS. 17a, 17b show a programming characteristic curve for two different PCM cells 2, denoted as CellA and CellB, with a further value to be sensed $I_{x3}$ close to the read current level $I_3$ (associated to the programming of the second intermediate state and bit level '10'). A possible exemplary sequence of set and reset programming pulses according to this embodiment is shown in FIGS. 18a, 18b.

Figure 18A:
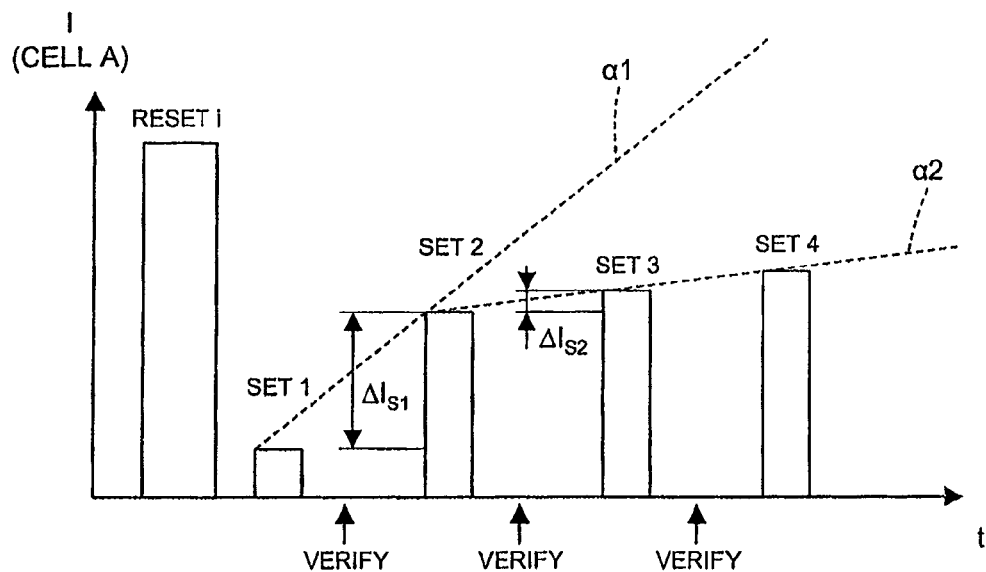
FIGS. 18a and 18b are plots showing exemplary set and reset programming pulses relating to a method for programming phase change memory cells according to another embodiment of the present disclosure.
Figure 18B:
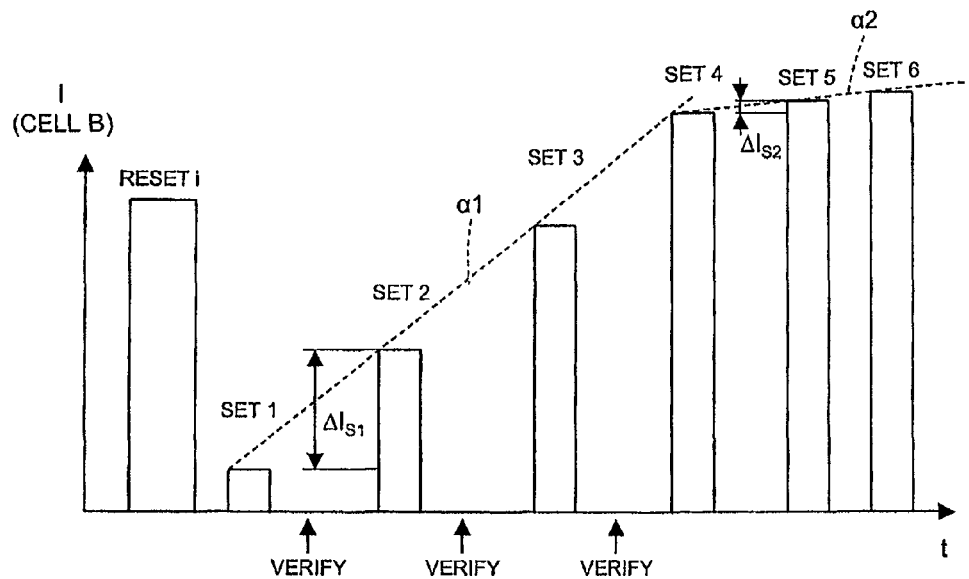

As shown in FIG. 18a for memory cell CellA, during a set sequence following a $i^{th}$ reset pulse $Reset_i$, the output current $I_o$ becomes higher than the further current value $I_{x3}$ after the second set pulse $Set_2$; afterwards, the reduced slope $\alpha_2$ and the smaller increase gradient $\Delta I_{s2}$ are applied to the set pulses. As shown in FIG. 18b for memory cell CellB, the output current $I_o$ becomes higher than the further current value $I_{x3}$ only after the fourth set pulse $Set_4$ has been applied, and afterwards the reduced slope $\alpha_2$ and the smaller increase gradient $\Delta I_{s2}$ are applied.

Figure 19:
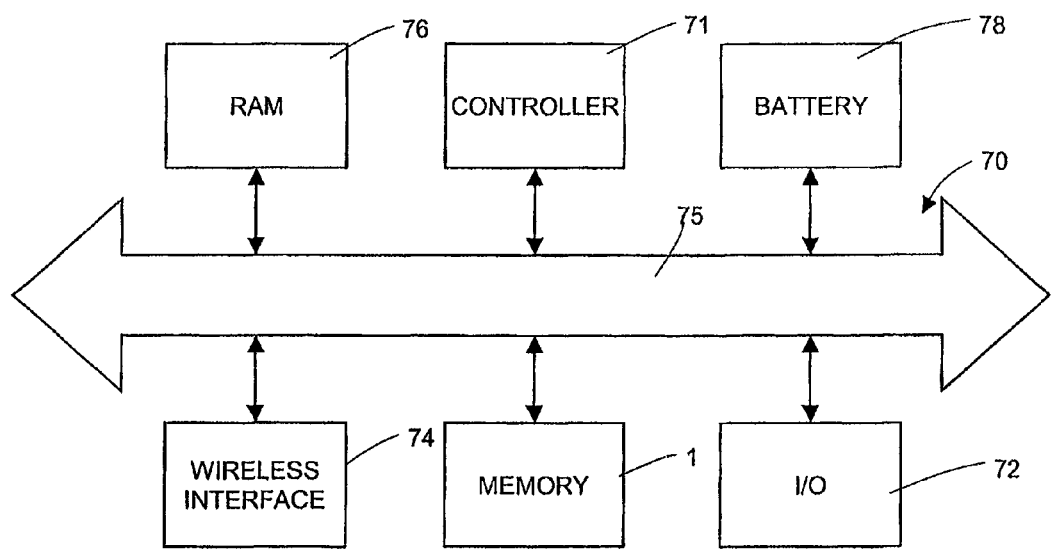
FIG. 19 is a system depiction of one embodiment of the present disclosure.

In FIG. 19, a portion of a system 70 in accordance with a further embodiment of the present disclosure is illustrated. System 70 may be used in devices such as, for example, a personal digital assistant (PDA), a laptop or portable computer, possibly with wireless capability, a cell phone, a messaging device, a digital music player, a digital camera, or other devices that may be adapted to process, store, transmit or receive information and require permanent storage capability.

System 70 may include a controller 71, an input/output (I/O) device 72 (e.g., a keyboard, display), the phase-change memory device 1, a wireless interface 74, and a RAM memory 76, coupled to each other via a bus 75. A battery 78 may be used to supply power to the system 70 in one embodiment. It should be noted that the scope of the present disclosure is not limited to embodiments having necessarily any or all of above listed components.

Controller 71 may comprise, for example, one or more microprocessors, digital signal processors, micro-controllers, or the like.

The I/O device 72 may be used to generate a message. The system 70 may use the wireless interface 74 to transmit and receive messages to and from a wireless communication network with a radio frequency (RF) signal. Examples of the wireless interface 74 may include an antenna, or a wireless transceiver, such as a dipole antenna, although the scope of the present disclosure is not limited in this respect. Also, the I/O device 72 may deliver a voltage reflecting what is stored as either a digital output (if digital information was stored), or as analog information (if analog information was stored).

From the foregoing description, the advantages that the multilevel programming method according to the present disclosure allows to be achieved are clear.

In particular, the minimum reset pulse allowing to program each intermediate desired state is dynamically and adaptively determined for each PCM cell 2, so that it is possible to carry out the programming operations with a higher accuracy and minimum stress occurring in each cell. Since reset pulses are applied that are specific to the characteristics of the PCM cells 2, amorphous caps 25 are formed with properties similar to each other, compensating for the differences in the geometrical and electrical characteristics of each cell with the variation of the reset current. The set programming pulses may have a smaller range, since they need to compensate for a smaller dispersion of the volume of the amorphous cap 25; in particular, this range will substantially be only a function of the stochastic phenomena occurring during the formation of the conductive path 27. The thermal effects of the heater during writing of the memory cell contents are greatly reduced, since the programming currents have smaller and less dispersed values. Also, the population of conductive paths 27 obtained by using the proposed method is more uniform and shows a more consistent behavior. In particular, the reset and set functions, iteratively generating the values for the reset and set pulses, may be adaptively adjusted during the programming operations, in order to dynamically adjust the algorithm to the specific characteristic of the memory cells to be programmed.

The proposed algorithm allows to determine, in an indirect manner, the most suitable reset value to supply to each PCM cell 2. Indeed, during a reading operation having a duration of 50-100 ns, it is not possible to perform a reliable and accurate program & verify operation on the reset population; in particular, in a time interval of the same duration as that of the reading operation, the values of the read current may allow determining if the cells are below or above a given current threshold (in the order of 1 μA) but may not allow to detect the exact value of the equivalent resistance of each cell, since the cell current is very small. The possibility to be able to indirectly determine the optimal reset values is thus clearly advantageous.

More in general, the disclosed programming algorithm allows achieving the following advantages: a reduction of the programming pulses; more "peaked" distributions; wider reading window; more stable data; and a better compensation of programming disturbances.

Finally, it is clear that numerous modifications and variations may be made to the method and the device described and illustrated herein, all falling within the scope of the disclosure.

In particular, it is clear that both programming and reading of the memory cells may be implemented using equally voltage or current electrical quantities. Accordingly, although in the foregoing description specific reference has been made to a memory device and PCM cells exploiting current pulses for programming and current levels for reading, it is to be understood that memory devices and PCM cells readable and/or programmable by voltage levels and pulses may also be used.

In the described programming algorithm the present values of the reset ($Reset_i$) and set ($Set_k$) pulses may be determined as any given function of the values assumed at the previous iteration. Also, the adjustment of the iterative reset and set functions f, g may envisage any kind of modification thereof, in particular based on the value reached by the iteration indexes i and k (and their approach to the respective maximum values $i_{max}$ and $k_{max}$) and/or the proximity to a given limit condition (denoted with "max pulse" in block 56 of FIG. 10b).

Clearly, more than two bits may be stored in each PCM cell 2 (e.g., three or four, corresponding to 8 and 16 programmed states, respectively). Moreover, different levels of reset pulses (in the $SCU_R$ sequence) may be used during the programming operations associated to each different programmed state of the memory cells.

Set/reset pulses may have different shapes, instead of being rectangular (or box-like). In particular, set/reset pulses may have sloping edges instead of vertical edges to control heating and cooling of the phase change material. For example, set/reset pulses may be triangular, with vertical leading edges and constantly sloping trailing edges, or trapezoidal, with vertical leading edges and constantly sloping trailing edges. Edge control prevents the formation of undesired amorphous pockets in crystalline paths. Furthermore, in both heating and cooling, the current density in the crystalline paths may be kept constant, to maintain stable and controlled temperature conditions in the phase change material, in an optimal temperature range for the formation of crystals. The adjusting of the set/reset function g/f may thus envisage also the modification of the pulse shape, e.g., from a rectangular shape to a shape with sloping edges.

The various embodiments described above can be combined to provide further embodiments. All of the U.S. patents, U.S. patent application publications, U.S. patent applications, foreign patents, foreign patent applications and non-patent publications referred to in this specification are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   programming a multilevel PCM cell, the programming including:
   forming an amorphous region of amorphous phase change material in a storage element of the PCM cell, the forming including applying to the PCM cell a first reset pulse having a first value; and
   forming a conductive path through said amorphous region by applying at least one set pulse, a size of said conductive path defining a programmed state of said PCM cell and an output electrical quantity associated therewith,
   wherein forming the amorphous region comprises adaptively and iteratively determining, during said programming, a suitable reset pulse suitable for programming said PCM cell, the adaptively and iteratively including:
   measuring the output electrical quantity;
   comparing the measuring output electrical quantity with a threshold; and
   based on the comparing, applying to the PCM cell a second reset pulse having a second value, different than the first value.

2. The method according to claim 1, wherein adaptively and iteratively determining comprises determining an optimized value of said suitable reset pulse that allows programming a desired programmed state in said PCM cell and a desired programmed level of said output electrical quantity.

3. The method according to claim 2, wherein adaptively and iteratively determining comprises determining an optimized value of said suitable reset pulse for each of a plurality of PCM cells and each programmed state among one or more intermediate programmed states between a fully-reset programmed state and a fully-set programmed state.

4. A method, comprising:
   programming a multilevel PCM cell, the programming including:
   forming an amorphous region of amorphous phase change material in a storage element of the PCM cell by applying at least one reset pulse; and
   forming a conductive path through said amorphous region by applying at least one set pulse, a size of said conductive path defining a programmed state of said PCM cell and an output electrical quantity associated therewith, and being controlled by values of said at least one reset pulse and at least one set pulse,
   wherein forming the amorphous region comprises adaptively and iteratively determining, during said programming, the value of said at least one reset pulse suitable for programming said PCM cell, and
   wherein adaptively and iteratively determining comprises:
   for each PCM cell, iteratively applying to said PCM cell one or more reset pulses in a sequence of reset pulses; and
   verifying, after applying each reset pulse, a value of the output electrical quantity associated with said PCM cell, for determining, among said reset pulses, the reset pulse with a minimum value that allows obtaining said desired programmed level of said output electrical quantity;
   iteratively determining a present reset pulse of said sequence as a first function of a previous reset pulse in said sequence, and
   interrupting the applying of said sequence after said desired programmed level of said output electrical quantity has been obtained.

5. The method according to claim 4, wherein during said sequence of reset pulses said first function generates an increase of a value of said present reset pulse with respect to said previous reset pulse of said sequence; and wherein adaptively and iteratively determining further comprises adjusting said first function during said sequence of reset pulses.

6. The method according to claim 4, wherein forming a conductive path comprises, during programming of a given one of said one or more intermediate programmed states: iteratively applying, after each reset pulse, one or more set pulses in a sequence of set pulses for converting portions of amorphous phase change material within said amorphous region into crystalline phase change material; and verifying, after each set pulse, if the output electrical quantity associated to said PCM cell has reached the desired programmed level, thereby interrupting said sequence of set pulses; a present set pulse of said sequence being iteratively determined as a second function of the previously determined set pulse in said sequence.

7. The method according to claim 6, wherein adaptively and iteratively determining comprises, in the event that said output electrical quantity associated with said PCM cell has not reached the desired programmed level after said sequence of set pulses has been performed, adjusting said first function in order to determine a decreased value for a next reset pulse.

8. The method according to claim 6, wherein applying a sequence of set pulses further comprises adjusting said second function during said sequence of set pulses.

9. The method according to claim 8, wherein each reset pulse in said sequence of reset pulses defines a programming characteristic curve associated to said PCM cell, along which each one of said set pulses defines a respective value of said output electrical quantity associated to said PCM cell; and wherein verifying if the output electrical quantity associated to said PCM cell has reached a desired programmed level comprises comparing said output electrical quantity to a lower threshold and to an upper threshold, which are associated to the intermediate programmed state to be programmed.

10. The method according to claim 9, wherein comparing said reading current comprises: defining a proximity threshold value close to, and lower than, said lower threshold, and determining a proximity condition in which said output electrical quantity becomes greater than said proximity threshold value; and wherein adjusting said second function comprises, after determining said proximity condition, decreasing an increase gradient between consecutive set pulses in said sequence, in order to more closely define the programmed value for said output electrical quantity.

11. The method according to claim 4, wherein a different volume of said amorphous region corresponds to each one of said reset pulses in said sequence of reset pulses.

12. A method, comprising:
programming a multilevel PCM cell, the programming including:
forming a first amorphous region of amorphous phase change material in a storage element of the PCM cell, forming the first amorphous region including applying a first reset pulse to the PCM cell;
forming a first conductive path through said first amorphous region by applying at least one set pulse to the PCM cell;
after forming the first conductive path, forming a second amorphous region of amorphous phase change material in the storage element of the PCM cell, forming the second amorphous region including applying to the PCM cell a second reset pulse that is different than the first reset pulse; and forming a second conductive path through said second amorphous region by applying at least one further set pulse to the PCM cell.

13. The method according to claim 12, wherein forming the first conductive path includes:
applying a first set pulse to the PCM cell;
verifying whether the first set pulse has obtained a selected programming level of the PCM cell;
in response to verifying that the first set pulse has not obtained the selected programming level of the PCM cell, applying a second set pulse to the PCM cell, the second set pulse being different than the first set pulse; and
verifying whether the second set pulse has obtained the selected programming level of the PCM cell.

14. The method according to claim 13, wherein forming the first conductive path includes:
in response to verifying that the second set pulse has not obtained the selected programming level of the PCM cell, applying a third set pulse to the PCM cell, the third set pulse being different than the second set pulse, the second set pulse having a different first feature than the first set pulse and the third set pulse having a different second feature than the second set pulse, the second feature being different than the first feature; and
verifying whether the third set pulse has obtained the selected programming level of the PCM cell.

15. The method according to claim 14, wherein the first feature is an amplitude and the second feature is a pulse duration.

16. The method according to claim 12, wherein forming the first conductive path includes:
applying a first set pulse to the PCM cell;
verifying whether the first set pulse has caused the PCM cell to achieve an electrical quantity that exceeds a first threshold;
in response to verifying that the first set pulse has caused the PCM cell to achieve the electrical quantity that exceeds the first threshold, verifying whether the electrical quantity of the PCM cell is less than a second threshold; and
in response to verifying that the electrical quantity of the PCM cell is not less than a second threshold, forming the second amorphous region in the storage element of the PCM cell.

17. The method according to claim 16, wherein the second reset pulse is set to be a first function of the first reset pulse and forming the first conductive path includes:
in response to verifying that the first set pulse has not caused the PCM cell to achieve the electrical quantity that exceeds the first threshold, applying a second set pulse to the PCM cell, the second set pulse being a second function of the first set pulse; and
verifying whether the second set pulse has caused the PCM cell to achieve the electrical quantity that exceeds the first threshold.

18. The method according to claim 17, wherein in response to verifying that the second set pulse has not caused the PCM cell to achieve the electrical quantity that exceeds the first threshold, adjusting the second function and applying to the PCM cell a third set pulse that is the adjusted second function of the second set pulse.

19. The method according to claim 16, wherein forming the second conductive path includes:
verifying whether applying the at least one further set pulse has caused the PCM cell to achieve the electrical quantity that exceeds the first threshold;

in response to verifying that the at least one further set pulse has caused the PCM cell to achieve the electrical quantity that exceeds the first threshold, verifying whether the electrical quantity of the PCM cell is less than the second threshold; and in response to verifying that the electrical quantity of the PCM cell is not less than the second threshold, adjusting the first function and forming a third amorphous region in the storage element of the PCM cell, forming the third amorphous region including applying a third reset pulse to the PCM cell, the third reset pulse being the adjusted first function of the second reset pulse.

20. The method according to claim 4, wherein adaptively and iteratively determining comprises determining an optimized value of said at least one reset pulse that allows programming a desired programmed state in said PCM cell and a desired programmed level of said output electrical quantity.

21. The method according to claim 20, wherein adaptively and iteratively determining comprises determining an optimized value of said at least one reset pulse for each of a plurality of PCM cells and each programmed state among one or more intermediate programmed states between a fully-reset programmed state and a fully-set programmed state.

22. A phase change memory device comprising:
a plurality of PCM cells;
a read/program unit configured to program the PCM cells; and
a control unit coupled to the read/program unit and configured to cause the read/program unit to program a selected PCM cell of the PCM cells according to a method that includes:
forming a first amorphous region of amorphous phase change material in a storage element of the selected PCM cell, forming the first amorphous region including applying a first reset pulse to the selected PCM cell;
forming a first conductive path through said first amorphous region by applying at least one set pulse to the selected PCM cell;
after forming the first conductive path, forming a second amorphous region of amorphous phase change material in the storage element of the selected PCM cell, forming the second amorphous region including applying to the selected PCM cell a second reset pulse that is different than the first reset pulse; and
forming a second conductive path through said second amorphous region by applying at least one further set pulse to the selected PCM cell.

23. The device according to claim 22, wherein each one of said PCM cells includes a storage element and a heating element having a region of contact with said storage element with sub-lithographic dimensions, and the heating element being operable to heat said storage element through application of said set and reset pulses.

24. A system comprising:
a processing unit;
an interface coupled to said processing unit; and
a phase-change memory device coupled to said processing unit, the phase-change memory device including:
a plurality of PCM cells;
a read/program unit configured to program the PCM cells; and
a control unit coupled to the read/program unit and configured to cause the read/program unit to program a selected PCM cell of the PCM cells according to a method that includes:
forming a first amorphous region of amorphous phase change material in a storage element of the selected PCM cell, forming the first amorphous region including applying a first reset pulse to the selected PCM cell;
forming a first conductive path through said first amorphous region by applying at least one set pulse to the selected PCM cell;
after forming the first conductive path, forming a second amorphous region of amorphous phase change material in the storage element of the selected PCM cell, forming the second amorphous region including applying to the selected PCM cell a second reset pulse that is different than the first reset pulse; and
forming a second conductive path through said second amorphous region by applying at least one further set pulse to the selected PCM cell.

25. The system according to claim 24, wherein each one of said PCM cells includes a storage element and a heating element having a region of contact with said storage element with sub-lithographic dimensions, and the heating element being operable to heat said storage element through application of said set and reset pulses.

* * * * *